US012682131B2

(12) United States Patent
Bouillon et al.

(10) Patent No.: US 12,682,131 B2
(45) Date of Patent: Jul. 14, 2026

(54) COMPUTER-IMPLEMENTED METHOD FOR PROVIDING A TEST PROCESS FOR TRAFFIC SCENARIOS TO BE TESTED

(71) Applicant: dSPACE GmbH, Paderborn (DE)

(72) Inventors: Patrick Bouillon, Paderborn (DE); Rainer Rasche, Paderborn (DE); Jens Horstmann, Paderborn (DE); Eyke Huellermeier, Paderborn (DE)

(73) Assignee: dSPACE SE & Co. KG, Paderborn (DE)

( * ) Notice: Subject to any disclaimer, the term of this patent is extended or adjusted under 35 U.S.C. 154(b) by 808 days.

(21) Appl. No.: 18/040,269

(22) PCT Filed: Jul. 26, 2021

(86) PCT No.: PCT/EP2021/070815
§ 371 (c)(1),
(2) Date: Feb. 2, 2023

(87) PCT Pub. No.: WO2022/028935
PCT Pub. Date: Feb. 10, 2022

(65) Prior Publication Data
US 2023/0359780 A1 Nov. 9, 2023

(30) Foreign Application Priority Data

Aug. 5, 2020 (DE) ..................... 10 2020 120 632.1
Jan. 7, 2021 (DE) ..................... 10 2021 100 149.8

(51) Int. Cl.
*G06F 30/15* (2020.01)
*G06N 20/00* (2019.01)

(52) U.S. Cl.
CPC ............. *G06F 30/15* (2020.01); *G06N 20/00* (2019.01)

(58) Field of Classification Search
CPC .......... G06F 30/00; G06F 30/15; G06F 30/27; G06N 20/00; G06N 3/0499; G06N 3/09;
(Continued)

(56) References Cited

U.S. PATENT DOCUMENTS 10,185,327 B1 * 1/2019 Konrardy ........... G01C 21/3461
2019/0155291 A1 * 5/2019 Heit .................... G06F 11/3684
(Continued)

FOREIGN PATENT DOCUMENTS

CN 108332977 B 6/2020
DE 102017200180 A1 7/2018
(Continued)

OTHER PUBLICATIONS

Halil Beglerovic et al. "Polar Occupancy Map—A Compact Traffic Representation for Deep Learning Scenario Classification", 2019 IEEE Intelligent Transportation Systems Conference (JTSC), Oct. 27, 2019 (Oct. 27, 2019), pp. 4197-4203, DOI: 10.1109/ITSC.2019. 8916947, ISBN: 978-1-5386-7024-8, XP055648801, the whole document.

(Continued)

*Primary Examiner* — Cedric Johnson
(74) *Attorney, Agent, or Firm* — Leydig, Voit & Mayer, Ltd.

(57) ABSTRACT

A computer-implemented method for providing a scenario test process includes: training and using a similarity classification module to classify the similarity between two scenarios based on respective subsets of respective parameter sets of the two scenarios; generating a graph representation including a multiplicity of scenarios, including the two scenarios, wherein respective nodes represent respective subsets of respective parameter sets of respective scenarios, and edges between respective nodes are weighted by a similarity classification value which indicates the similarity (Continued)

between respective scenarios corresponding to the respective nodes; receiving an input including a required value for covering scenarios stored in a storage unit and/or a required number of scenarios to be tested, such that a selection and an order of execution of scenarios is determined; and providing the selection and the order of execution and/or a coverage value of an overall coverage of the selection of scenarios.

13 Claims, 9 Drawing Sheets

(58) Field of Classification Search
CPC G06N 3/092; G06N 5/01; G06N 3/08; G06N 20/10; G08G 1/167; G01M 17/007
USPC ........................................................ 703/8, 6
See application file for complete search history.

(56) References Cited

U.S. PATENT DOCUMENTS

2020/0081445 A1* 3/2020 Stetson ............... B60W 60/001
2024/0001930 A1 1/2024 Hu et al.

FOREIGN PATENT DOCUMENTS

| DE | 102018133576 A1 * | 7/2019 | ........ B60W 60/0011 |
| WO | WO 2017210222 A1 | 12/2017 | |
| WO | 2020052344 A1 | 3/2020 | |

OTHER PUBLICATIONS

Gruner Richard et al. "Spatiotemporal representation of driving scenarios and classification using neural networks", 2017 IEEE Intelligent Vehicles Symposium (JV), IEEE, Jun. 11, 2017 (Jun. 11, 2017), pp. 1782-1788, DOI: 10.1109/IVS.2017.7995965, XP033133943, the whole document.

* cited by examiner

Fig. 4

Scenario storage unit SE2

S1

Triplet

SVR1

Triplet

SVR1

Storage unit SE1

$SCV_{S1,S2} = 1$
$SCV_{S2,S3} = 0,5$
Triplet $SCV_{S1,S3} = 0,5$

Fig. 7

Coverage values CV before scenario S1 is selected    Coverage values CV after scenario S1 is selected

SE2

SVR

SCM

SE1,
contains SVR
and SCV

Test
system    User

Input    SVR    SCV

Order of
execution

COMPUTER-IMPLEMENTED METHOD FOR PROVIDING A TEST PROCESS FOR TRAFFIC SCENARIOS TO BE TESTED

CROSS-REFERENCE TO PRIOR APPLICATIONS

This application is a U.S. National Phase application under 35 U.S.C. § 371 of International Application No. PCT/EP2021/070815, filed on Jul. 26, 2021, and claims benefit to German Patent Application No. DE 10 2020 120 632.1, filed on Aug. 5, 2020, and German Patent Application No. DE 10 2021 100 149.8, filed on Jan. 7, 2021. The International Application was published in German on Feb. 10, 2022 as WO 2022/028935 A1 under PCT Article 21(2).

FIELD

The present invention relates to a computer-implemented method for providing a scenario test process in relation to scenarios to be tested, in particular traffic scenarios, for tests of a device for driving a vehicle at least partially autonomously. The present invention further relates to a testing unit for which a scenario test process of traffic scenarios to be tested is executed. Moreover, the present invention relates to a computer program and to a computer-readable data medium.

BACKGROUND

Driver assistance systems such as adaptive cruise control and/or functions for highly automated driving can be verified or validated using various test methods. In the process, hardware-in-the-loop methods, software-in-the-loop methods, simulations, and/or test trips can be used in particular.

The effort required, in particular the time spent and/or costs involved, for testing these kinds of vehicle functions using the aforementioned test methods is typically very high since a large number of possible driving situations potentially have to be tested.

For time and cost reasons, it is not possible to test an at least partially autonomous vehicle solely on roads with distances of over billions of kilometers. In addition, this would result in high numbers of redundant test kilometers while critical yet unusual situations that are relevant for the capabilities of the at least partially autonomous vehicle do not arise.

This may in particular lead to high costs for both test trips and simulations. DE 10 2017 200 180 A1 describes a method for verifying and/or validating a vehicle function provided for autonomously driving a vehicle in the longitudinal and/or transverse direction. The method comprises determining a test control instruction of the vehicle function at an actuator of the vehicle on the basis of surroundings data related to surroundings of the vehicle, the test control instruction not being implemented by the actuator. The method further comprises simulating, on the basis of surroundings data and by using a road user model related to at least one road user in the surroundings of the vehicle, a fictitious traffic situation that would apply if the test control instruction had been implemented. The method additionally comprises providing test data related to the fictitious traffic situation. In this case, in order to determine the test control instruction, the vehicle function is operated passively in the vehicle. The drawback of this method is that, for the vehicle function to be verified and/or validated, the vehicle actually has to be operated so that the required data can be determined.

Manufacturers of at least partially autonomous vehicles require a parallelized, simulation-based solution. This is where the "scenario-based testing" method comes in. In this case too, though, each scenario to be tested requires time and thus incurs costs. Manufacturers of at least partially autonomous vehicles have databases containing thousands of scenarios in which duplicate or very similar scenarios accumulate over time. Even with huge parallelization, testing all the scenarios is too time-consuming.

SUMMARY

In an exemplary embodiment, the present invention provides a computer-implemented method for providing a scenario test process in relation to scenarios to be tested, in particular traffic scenarios, for tests of a device for driving a vehicle at least partially autonomously. The method includes: training and using a similarity classification module to classify the similarity between two scenarios based on respective subsets of respective parameter sets of the two scenarios, wherein the two scenarios are virtual representations of actual traffic situations; generating a graph representation including a multiplicity of scenarios, including the two scenarios, wherein respective nodes represent respective subsets of respective parameter sets of respective scenarios, and edges between respective nodes are weighted by a similarity classification value which indicates the similarity between respective scenarios corresponding to the respective nodes; receiving a user input via an electronic user interface and/or an automatic system input, wherein the input includes a required value for covering scenarios stored in a storage unit and/or a required number of scenarios to be tested, such that a selection and an order of execution of scenarios is determined to ensure the graph has maximum coverage; and providing the selection and the order of execution and/or a coverage value of an overall coverage of the selection of scenarios.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 4 shows an embodiment according to the invention for generating triplet training data for a similarity classification module for the purpose of classifying the similarity between two scenarios, as part of the method for providing a test process in relation to traffic scenarios to be tested for tests of a device for driving a vehicle at least partially autonomously;

FIG. 7 is a depiction of a graph representation according to the invention after a further selection of a node, and thus of the represented scenario;

DETAILED DESCRIPTION

Figure 1:
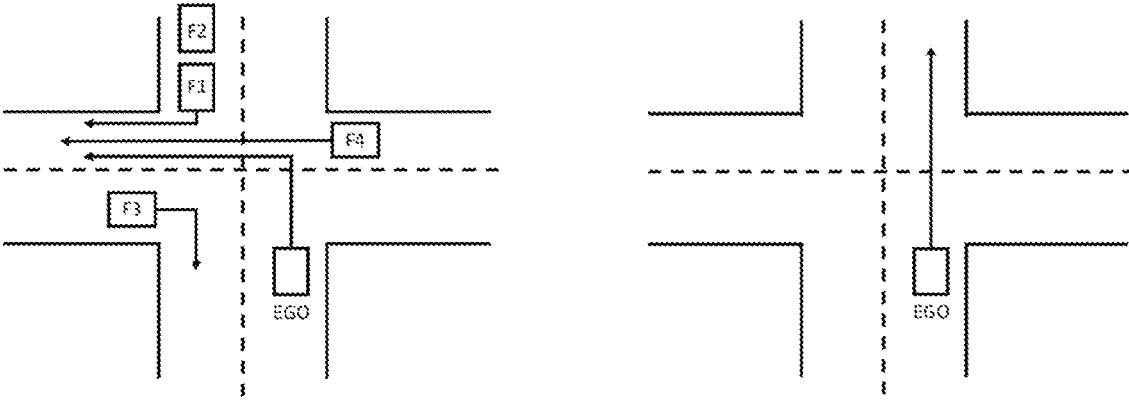
FIG. 1 is a schematic illustration of the claimed differentiation of the subset of a parameter set of a scenario.

In exemplary embodiments of the invention, duplicated and similar scenarios are identified, and an order of execution that helps maximize the coverage of the scenarios is thus determined.

Exemplary embodiments of the invention provide a method, a testing unit, a computer program, and a computer-readable data medium that can efficiently determine an order of execution of scenarios within the framework of scenario-based testing for systems and system components in highly automated driving.

In an exemplary embodiment, the invention provides a computer-implemented method for providing a scenario test process in relation to traffic scenarios to be tested for tests of a device for driving a vehicle at least partially autonomously, by a testing unit, for which a test process of traffic scenarios to be tested is executed, by a computer program, and by a computer-readable data medium.

In scenario-based testing of systems and system components for driving a motor vehicle autonomously, scenarios are defined, which can be referred to as an abstraction of a traffic situation. For each scenario, test cases can then be executed in turn. In this context, a logical scenario is the abstraction of a traffic situation including the road, the driving behavior, and the surrounding traffic, without any concrete parameter values. When concrete parameter values are selected, the logical scenario becomes a concrete scenario. Each concrete scenario of this kind corresponds to a specific traffic situation.

For parameter sets, a distinction can be drawn between scenery parameters and driving situation parameters, all the parameters having a predetermined definition range.

By way of example, roads having different lane markings, different terrains, intersections, corners, and road restrictions may all pose a challenge in the context of scenery parameters. In addition, driving situation parameters may be determined by the number and type of road users. Driving situation parameters thus reflect moving objects in the scenario, such as the number of road users, the type of road users, the number of lane changes and/or maneuvers carried out by the road users.

An autonomous driving function is implemented by a system, for example a control unit. Conventionally, the control unit is tested in the actual vehicle in actual traffic situations, validated using hardware-in-the-loop tests or, alternatively, entirely virtual tests.

The method further comprises training and using a similarity classification module for the purpose of classifying the similarity between two scenarios on the basis of a subset of a parameter set of each scenario.

The subset of a parameter set is provided by a scenario vector representation. The scenario vector representation contains differentiating, static variables of a parameter set of a scenario, including scenery parameters and driving situation parameters that make it possible to differentiate actual traffic situations from one another.

Each structured, machine-readable data object depicting a scenario contains thousands of properties. Some of the properties are not needed in order to recognize redundant scenarios. For example, the starting position of the road network within the coordinate system of a scenario is irrelevant for establishing whether the autonomous driving is functioning properly. By contrast, the number of lanes is important for testing control units since additional lanes may be used for avoidance maneuvers. Moreover, if there is no additional lane, this is disastrous if the control unit performs an avoidance maneuver.

According to the invention, therefore, essential features depicting a scenario are merged in a vector representation and used as an input for the similarity classification module.

In the context of the present method, therefore, a machine learning method and model are advantageously used, for example preferably a perceptron, an artificial neural network, support vector machines, and/or reinforcement learning; their task is to determine the similarity between scenarios, depicted in a scenario vector representation.

The perceptron is a simplified artificial neural network consisting of a single artificial neuron having adjustable weightings and a threshold value. The present method uses a triplet approach to bring about a similarity conclusion from a perceptron. Experts make available training data that allow a conclusion to be drawn as to whether scenario S2 is more similar to S1 than scenario S3. Accordingly, feedback on the weighting is returned in an amount of 1 or −1 so that the perceptron can adjust weights by way of a supervised learning method and learn how to recognize similarities between scenarios and can then autonomously draw similarity conclusions.

The present method can also determine the similarity between two scenarios by using an artificial neural network. By using an artificial neural network to identify similarities between scenarios, the present method can employ a reinforcement and/or supervised learning method. Unlike reinforcement learning using an artificial neural network, training in supervised learning is carried out using specific training data. In this case, training data may be provided by pre-existing simulation results or by experts through an evaluated similarity among scenarios.

Instead, there are two parties in reinforcement learning: the network, generally referred to as the agent, and the environment. The environment may also be considered a game area on which the current state or current position of the agent is read. The network executes an action on the basis of the current state. This action changes the state of the environment. The network receives the new state and a rating of the executed action as feedback from the environment.

The aim is to achieve the best possible rating, i.e., to maximize the rating. Consequently, the weights of the neural network are adjusted in the learning process on the basis of the rating of the executed move, and a new action is carried out. By successively adjusting the weights, the network learns the best possible action to carry out, i.e., a strategy for obtaining the best possible rating. Analogously, if the intention is to obtain a minimum, the rating can also be minimized by a simple adjustment.

Besides the application of reinforcement learning using artificial neural networks, other methods such as Monte Carlo and/or temporal difference learning can also be used in the context of reinforcement learning.

A support vector machine is a pattern recognition method that is implemented in computer programs and thus indicates the similarity between scenarios in accordance with the present method. For this purpose, a set of training objects is needed, which may be pre-classified by experts or be available through existing simulation results of previous tests. In the context of support vector machines, each object is represented by a vector in a vector space. According to the invention, scenarios are described as scenario vector representations. The task of the support vector machine is to place into said space at least one hyperplane that divides the objects into at least two classes. Similar scenario vector representations are determined thereby.

To avoid the unnecessary testing of high numbers of traffic situations, and thus of parameter sets, using conventional simulation processes, in the context of the present method the similarity between scenarios is determined by the similarity classification module such that very similar parameter combinations are detected and not validated in duplicate.

The result of the similarity classification module for two scenarios is indicated by the similarity classification value, which is preferably in a numerical value range between 0 and 1, where 0 indicates no similarity between the scenarios and 1 indicates a full match in terms of the relevant scenario vector representations, i.e., the subset of a parameter set. In other embodiments, the similarity classification value may also be indicated on different scales.

All the scenario vector representations and respective similarity classification values are stored in a storage unit that is configured to track the relationships between the vectors and similarities.

To determine a suitable order of execution that includes the most divergent scenarios possible, a graph representation including a multiplicity of scenarios, preferably all the scenario vector representations in the storage unit, is generated. In the graph representation, the nodes constitute the scenario vector representations, i.e., a subset of the parameter set of the scenario, and edges between two nodes are weighted using the similarity classification value such that the similarity between two nodes, and thus the represented scenarios, is indicated.

By receiving a user input via an electronic user interface and/or an automatic system input, wherein the input includes a required value for covering the scenarios stored in the storage unit, and/or a required number of scenarios to be tested, such that an objective is determined for the method, a selection and an order of execution of the scenarios, and thus of the representative nodes, is then determined in accordance with the given input, with the objective of ensuring the graph has maximal coverage. If an overall coverage of at least 70% of the stored scenarios, and thus of the actual traffic situations, is needed, a selection and an order of execution up to this threshold value is determined. It goes without saying that other embodiment examples with different inputs for an overall coverage are possible. If the input indicates a maximum number of scenarios, the scenarios are selected and the order of execution that corresponds to an optimal coverage within the bounds of the limiting threshold value is determined. A method according to the invention can thus deliver results in relation to available resources.

To select the next node, and thus the represented scenario, i.e., the subset of a parameter set of a scenario, a greedy algorithm can preferably be used. Algorithms of this kind are notable in that they progressively select the next state that promises the highest yield or best result at the time of the selection, the result in this case being the highest possible coverage of scenarios on the basis of the input by the user or a predetermined system input.

By using the present method, a "cutting-off" scenario, for example, can be differentiated from other scenarios. A cutting-off scenario can refer to a traffic situation in which a highly automated or autonomous vehicle is driving in a predetermined lane and another vehicle traveling at a slower speed than the ego vehicle lurches into the lane of the ego vehicle from a different lane at a particular distance away. Here, the ego vehicle denotes the vehicle to be tested.

The speed of the ego vehicle and the speed of the other vehicle, which is also referred to as the fellow vehicle, are constant in this case. Since the speed of the ego vehicle is higher than that of the fellow, the ego vehicle has to be braked in order to prevent the two vehicles from colliding. However, a cutting-off scenario may present itself in various forms, for example with different roadway widths or a different number of lanes.

The scenarios selected according to the method, in the defined order of execution, can then advantageously be validated as part of virtual tests of the control unit, so a method according to the invention allows control units for autonomously driving vehicles to be virtually validated more efficiently.

As part of the tests of a device for driving a vehicle at least partially autonomously on the basis of the order of execution of the scenarios, dynamic variables of a parameter set that are not part of the scenario vector representation, including the speed of a road user, can then also be varied and tested.

Further embodiments of the present invention are set out in the description below, with reference to the drawings.

The testing unit provides a test process in relation to traffic scenarios to be tested for tests of a device for driving a vehicle at least partially autonomously.

Advantageously, therefore, the testing unit is able to determine corresponding scenarios for tests in a suitable order of execution in relation to, for example, a cutting-off scenario.

According to a further aspect of the invention, a computer program is also provided, comprising program code for carrying out a method according to the invention when the computer program is executed on a computer. According to a further aspect of the invention, a data medium is provided, comprising program code of a computer program for carrying out a method according to the invention when the computer program is executed on a computer.

The method features described herein can be used to identify a test process of a multiplicity of different scenarios or driving situations. Likewise, the testing unit according to the invention is suitable for testing a multiplicity of different devices or control units of, for example, automobiles, utility vehicles, and/or commercial vehicles, boats, or aircraft, as part of a test process for a multiplicity of different scenarios or driving situations.

FIG. 1 is a schematic illustration of the claimed differentiation of the subset of a parameter set (SVR) of a scenario ($S_1$ to $S_n$). By way of example, FIG. 1 shows an intersection scenario with different numbers of fellow vehicles. The first scenario $S_1$ in FIG. 1 shows a left-turn maneuver of the ego vehicle, with four fellow vehicles likewise traveling through the intersection area. In the second scenario $S_2$ in FIG. 1, the ego vehicle is traveling straight across the intersection area, without any influence from fellow vehicles. Despite the road architecture, roadside structures, and corners being the same, these scenarios $S_1$ and $S_2$ are clearly different, so a different subset of a parameter set directly related to the actual traffic situations is identified, and different values for the scenario vector representations (SVR) are thus generated. In the scenario vector representation (SVR), values for, e.g., roadside structures and corners are given the same values but different values are defined for the number of fellow vehicles. Lastly, a lower similarity classification value (SCV) between the scenarios $S_1$ and $S_2$ is determined on the basis of their scenario vector representation (SVR).

Figure 2:
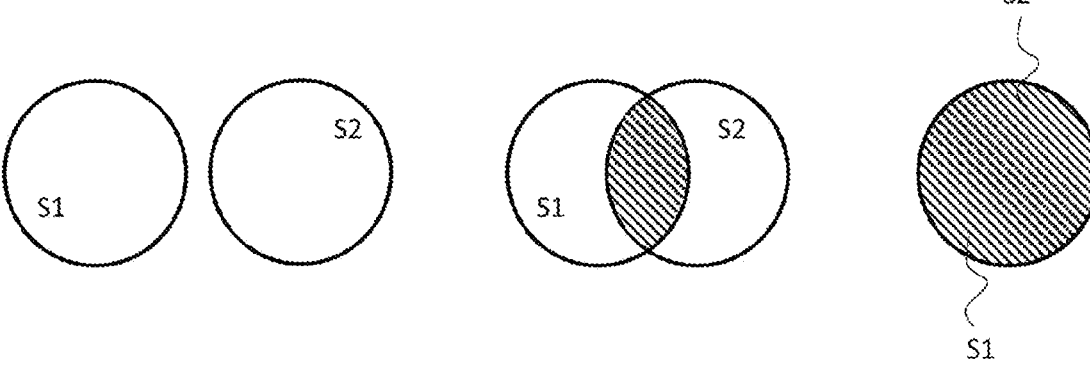
FIG. 2 is a schematic illustration of the claimed differentiation of scenarios.

FIG. 2 is a schematic illustration of the claimed differentiation of scenarios ($S_1$ to $S_n$). According to FIG. 2, the scenarios $S_1$ to $S_2$ may be entirely different in terms of the subset of their parameter set, or may have overlapping parameters, or be identical in terms of the subset of their respective parameter sets.

Figure 3:
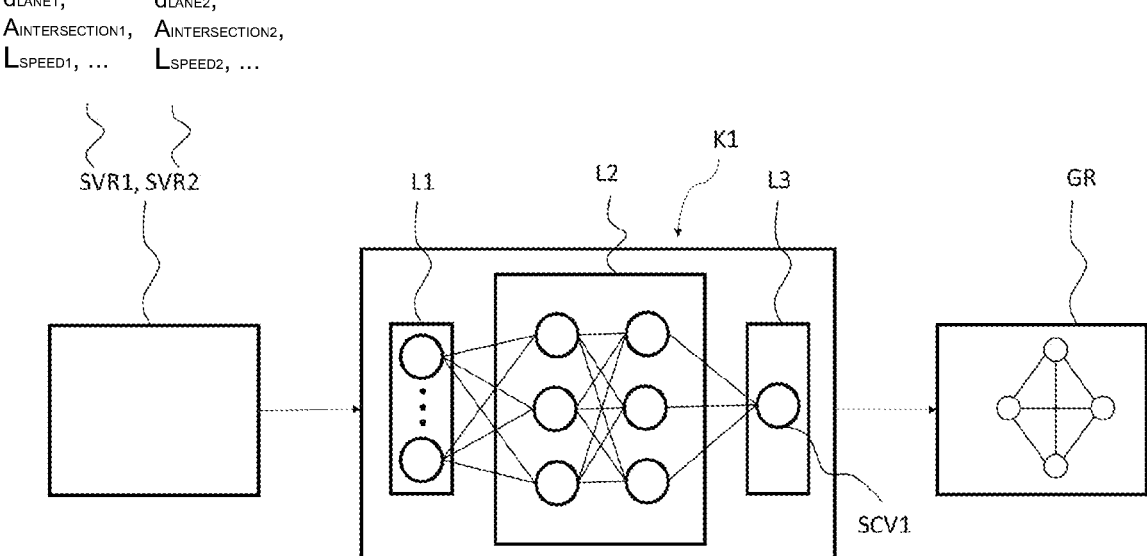
FIG. 3 is a flowchart for training and using a similarity classification module for the purpose of classifying the similarity between two scenarios, as part of the method for providing a test process in relation to traffic scenarios to be tested for tests of a device for driving a vehicle at least partially autonomously according to a preferred embodiment of the invention.

FIG. 3 is a flowchart for training and using a similarity classification module (SCM) for the purpose of classifying the similarity between two scenarios, as part of the method for providing a test process in relation to traffic scenarios to be tested for tests of a device for driving a vehicle at least partially autonomously according to a preferred embodiment of the invention.

The artificial neural network K1 shown in FIG. 3 has an input layer L1, a plurality of hidden layers L2, and an output layer L3. The output of the artificial neural network K1 is a similarity classification value (SCV). In a configuration according to the invention, the similarity classification value (SCV) is in a numerical value range between 0 and 1, where 0 indicates that the scenarios are completely different and 1 indicates a match in terms of the subset of the parameter set, i.e., of the scenario vector representation (SVR).

To train the artificial neural network K1, at least one pre-classified value pair of a subset of a parameter set $SVR_1$ and $SVR_2$, and thus the similarity classification value $SCV_{(S1,S2)}$, or also triplets of pre-classified subsets of a parameter set ($SVR_1$, $SVR_2$, $SVR_3$), may be used. Alternatively, the plurality of subsets of parameter sets $SVR_1$, $SVR_2$, . . . , $SVR_n$ and the corresponding similarity classification values $SCV_{(S1,S2)}$ to $SCV_{(Sn,Sm)}$ may be generated by a simulation, for example.

Figure 4:
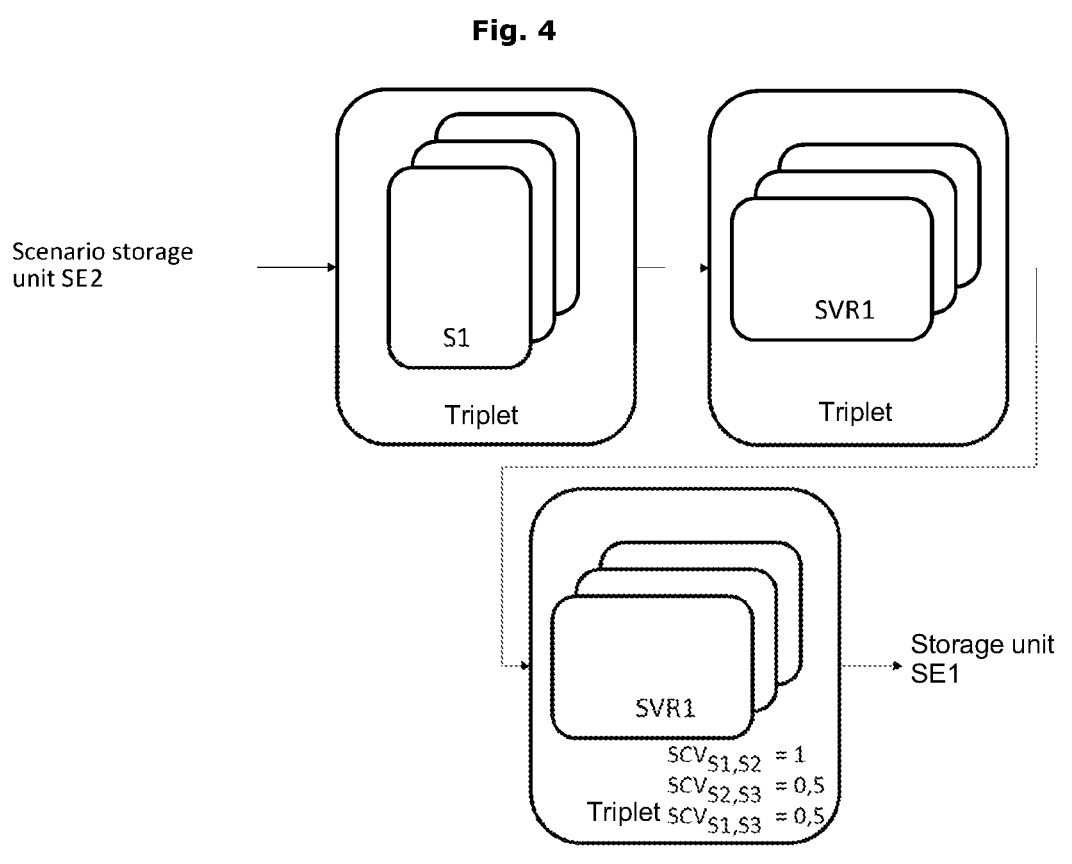

FIG. 4 shows an embodiment according to the invention for generating triplet training data for a similarity classification module (SCM) for the purpose of classifying the similarity between two scenarios, as part of the method for providing a test process in relation to traffic scenarios to be tested for tests of a device for driving a vehicle at least partially autonomously.

For this purpose, according to FIG. 4 three scenarios $S_1$ to $S_3$ are selected from a further storage unit ($SE_2$). The scenario vector representations $SVR_1$ to $SVR_3$ are generated for the scenarios. Similarity classification values (SCV) are then determined for this triplet, preferably by experts or simulation results from pre-generated simulations for testing a device for driving a vehicle at least partially autonomously. These triplets can then be used as input training data for machine learning methods and models, such as, according to the invention, a perceptron, a neural network, reinforcement learning, and/or support vector machines.

All the scenario vector representations (SVR) and respective similarity classification values (SCV) are stored in a suitable storage unit ($SE_1$) that is configured to track the relationships between the vectors and similarities.

Figure 5:
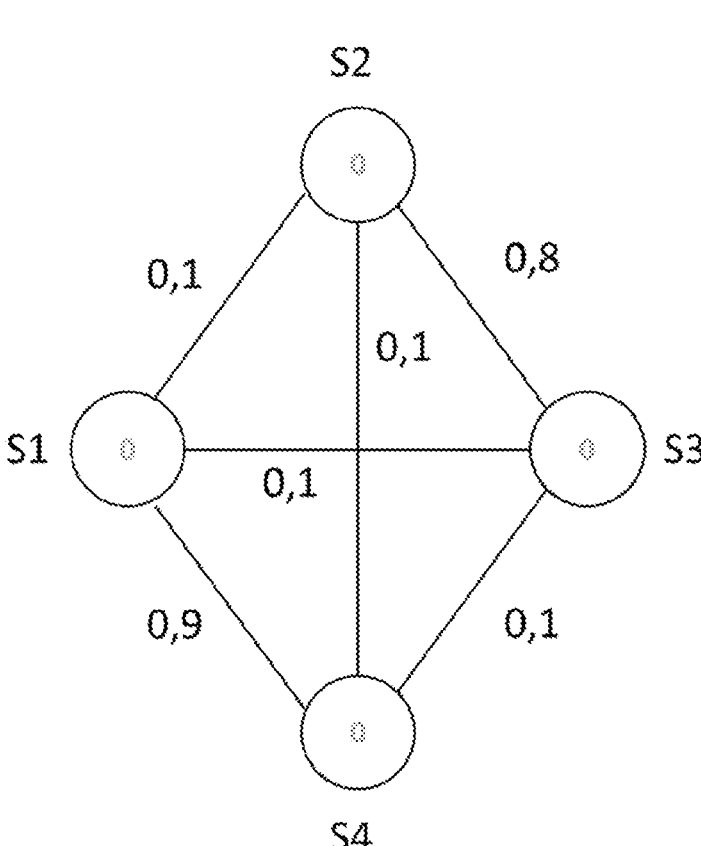
FIG. 5 is a depiction of a graph representation according to the invention without any node, and thus the represented scenario, having been selected.

FIG. 5 is a depiction of a graph representation (GR) according to the invention, without a first node having been selected. Generating a graph representation (GR) encompasses a multiplicity of scenarios, the subset of parameter sets, i.e., scenario vector representation, of which is stored in a suitable storage unit ($SE_1$). In the graph representation (GR), nodes each represent the subset of a parameter set of a scenario, and edges between two nodes are weighted with a similarity classification value which indicates the similarity between the two scenarios, i.e., the respective nodes.

Figure 6:
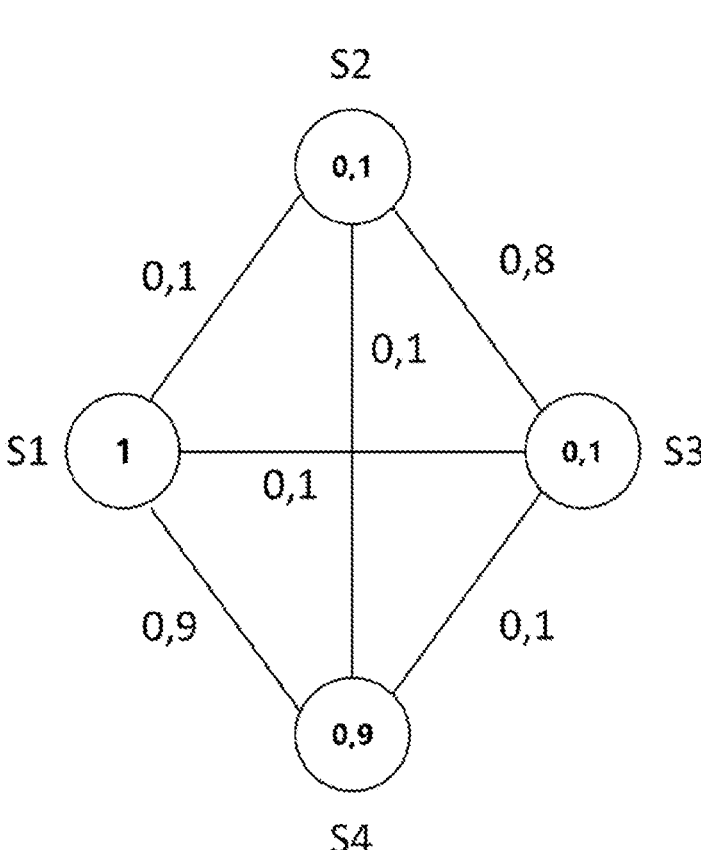
FIG. 6 is a depiction of a graph representation according to the invention after the first selection of a node, and thus of the represented scenario.

FIG. 6 is a depiction of a graph representation according to the invention after the first selection of a node. By way of example, the node, and thus the represented scenario $S_1$, has been selected in FIG. 6. This node then has a coverage value (CV) having the numerical value 1. The other nodes, and thus represented scenarios $S_2$ to $S_4$, are given a coverage value (CV) of the similarity classification value (SCV) in relation to $S_1$.

Figure 7:
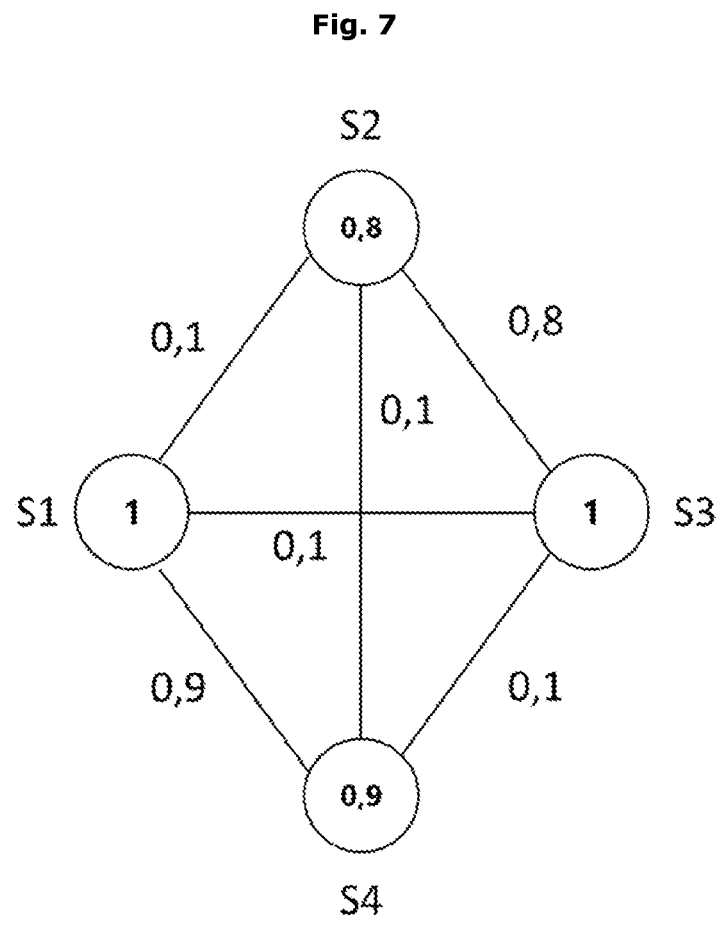

FIG. 7 is a depiction of a graph representation according to the invention after another selection of a node. By way of example, the node, and thus the represented traffic scenario $S_3$, has been selected according to FIG. 7. This step also gives this node the coverage value (CV) 1. The further nodes, and thus represented scenarios, are given the numerical value of the maximum similarity in relation to the similarity classification value (SCV) for the nodes $S_1$ or $S_3$, depending on which numerical value is higher.

Figure 8:
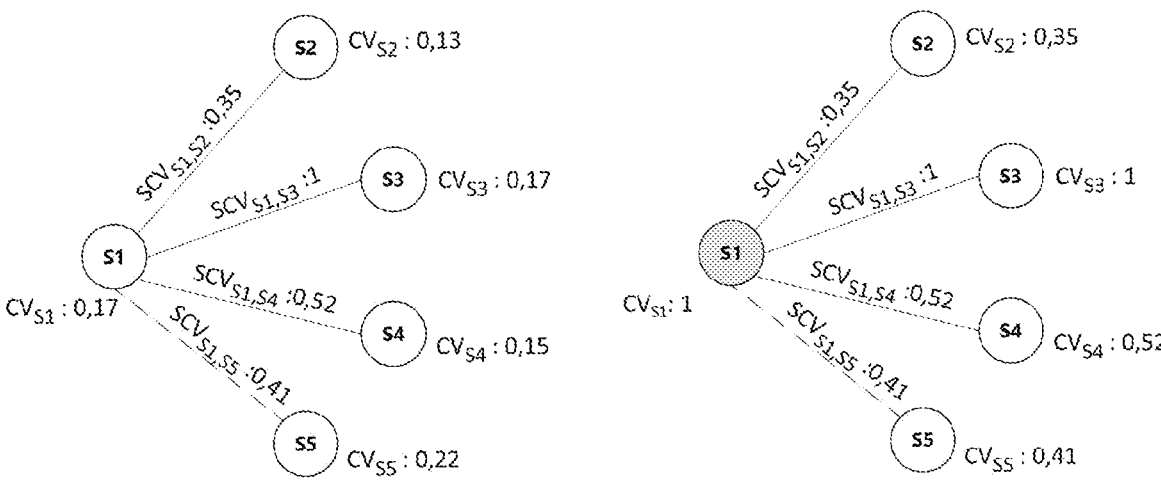
FIG. 8 shows a further advantageous embodiment of a graph representation and of the determination of coverage values after the selection of a node, and thus of the represented scenario.

FIG. 8 shows a further advantageous embodiment of a graph representation (GR) and the determination of coverage values (CV) after the selection of a node, and thus of the represented scenario.

The graph representation (GR) in FIG. 8 has five nodes, i.e., represented scenarios $S_1$-$S_5$, that is, actual traffic situations. A first coverage value (CV) and a similarity classification value (SCV) have already been determined for all the nodes. Once the node, and thus scenario $S_1$, has been selected, the corresponding coverage values (CV) are replaced and each have a coverage value (CV) of the maximum similarity classification value (SCV) in relation to $S_1$. Owing to the similarity classification value with the numerical value 1, it can be assumed that $S_3$ is covered in its entirety after $S_1$ is selected, in terms of their respective scenario vector representations (SVR).

In this particular and advantageous embodiment in FIG. 8, the graph representation (GR) is used specifically to determine matches, and thus similarity values (SCV), between one traffic scenario $S_1$ and other scenarios, and thus to examine the extent to which the scenario $S_1$ includes redundant tests compared with the other scenarios $S_2$-$S_5$. A weighting of scenarios can also be provided thereby.

Figure 9:
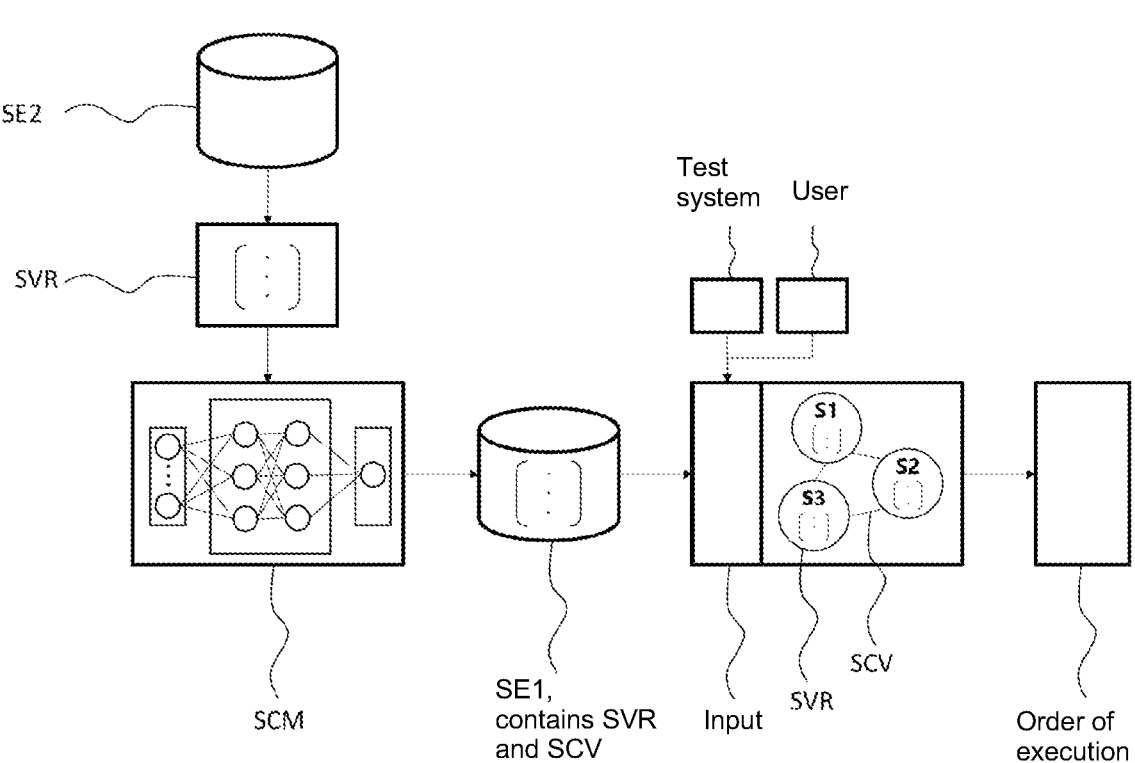
FIG. 9 is a depiction of a method according to the invention for determining a test process in relation to traffic scenarios to be tested for tests of a device for driving a vehicle at least partially autonomously.

FIG. 9 is a depiction of a method according to the invention for determining a test process in relation to traffic scenarios to be tested for tests of a device for driving a vehicle at least partially autonomously.

Firstly, in FIG. 9, the scenarios, which are also represented by measurement data and of which large numbers are available at manufacturers of at least partially autonomous vehicles, are kept in the storage unit SE2. Scenario vector representations (SVR) are generated on the basis of the scenarios in the storage unit SE2. These scenario vector representations (SVR) are inputs for the similarity classification module (SCM). The determined similarity classification values (SCV) are stored by the similarity classification module in connection with the corresponding scenario vector representations (SVR) in the storage unit SE1. The entries from storage unit SE1 are then used as inputs for the graph representation (GR). The graph representation (GR) determines coverage values (CV) and, as a result, an order of execution of the scenario vector representations.

Although specific embodiments have been illustrated and described herein, it will be appreciated by a person skilled in the art that a multiplicity of alternative and/or equivalent implementations exist. It should be noted that the exemplary embodiment or exemplary embodiments are only examples and are not intended to limit the scope, applicability, or configuration in any way.

Rather, the foregoing summary and detailed description will provide a person skilled in the art with a convenient road map for implementing at least one exemplary embodiment; it goes without saying that various changes may be made in the functional scope and arrangement of elements without departing from the scope of the appended claims and their legal equivalents.

Generally speaking, this application is intended to cover amendments, adaptations, or variations to the embodiments set out herein.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A computer-implemented method for providing a scenario test process in relation to scenarios to be tested, in particular traffic scenarios, for tests of a device for driving a vehicle at least partially autonomously, comprising:

training and using a similarity classification module to classify similarity between two scenarios based on respective subsets of respective parameter sets of the two scenarios, wherein the two scenarios are virtual representations of actual traffic situations;

generating a graph representation including a multiplicity of scenarios, including the two scenarios, wherein respective nodes represent respective subsets of respective parameter sets of respective scenarios, and edges between respective nodes are weighted by a similarity classification value which indicates the similarity between respective scenarios corresponding to the respective nodes;

receiving a user input via an electronic user interface and/or an automatic system input, wherein the input includes a required value for covering scenarios stored in a storage unit and/or a required number of scenarios to be tested, such that a selection and an order of execution of scenarios is determined such that the graph has maximum coverage; and providing the selection and the order of execution and/or a coverage value of an overall coverage of the selection of scenarios.

2. The computer-implemented method according to claim 1, wherein a parameter set for a respective scenario includes:

scenery parameters including at least one of: a number of lanes and/or a width thereof and/or corners and/or road restrictions and/or ambient temperature; and driving situation parameters, which describe a number and properties of moving objects in the scenario, including: a number of road users and/or a number of lane changes in a traffic situation.

3. The computer-implemented method according to claim 1, wherein respective scenarios are described by a respective subset of a respective parameter set of the scenario.

4. The computer-implemented method according to claim 1, wherein scenario vector representations for respective scenarios contain differentiating variables, including scenery parameters and driving situation parameters differentiating respective actual traffic situations from one another.

5. The computer-implemented method according to claim 1, wherein a scenario vector representation of a traffic scenario is stored in a central storage apparatus and requires less storage capacity than a non-vector-represented scenario.

6. The computer-implemented method according to claim 1, wherein scenarios encompass a multiplicity of tests of a device for driving a vehicle at least partially autonomously, and wherein road user speeds are varied in the tests.

7. The computer-implemented method according to claim 1, wherein the similarity classification module for classifying the similarity between two scenarios utilizes machine learning.

8. The computer-implemented method according to claim 7, wherein training data for the similarity classification module is supplied through user input and/or measurement results, and/or is given by previous simulation results of previous tests.

9. The computer-implemented method according to claim 1, wherein the classification of the similarity is expressed by the similarity classification module via a similarity classification value between 0 and 1.

10. The computer-implemented method according to claim 1, wherein a first node being selected in a form of a subset of a parameter set in the graph corresponds to a coverage value of 1 being indicated, and for adjacent nodes in the graph a maximum similarity classification value between the first node and each adjacent node is set as the coverage value.

11. The computer-implemented method according to claim 10, wherein a maximum possible coverage is opted for in connection with selecting a further node.

12. A testing device for providing a scenario test process in relation to scenarios to be tested, in particular traffic scenarios, for tests of a device for driving a vehicle at least partially autonomously, comprising:

a memory having executable instructions stored thereon; and a control unit;

wherein the control unit is configured to execute the instructions to facilitate the following being performed by the testing device:

training and using a similarity classification module to classify similarity between two scenarios based on respective subsets of respective parameter sets of the two scenarios, wherein the two scenarios are virtual representations of actual traffic situations;

generating a graph representation including a multiplicity of scenarios, including the two scenarios, wherein respective nodes represent respective subsets of respective parameter sets of respective scenarios, and edges between respective nodes are weighted by a similarity classification value which indicates the similarity between respective scenarios corresponding to the respective nodes;

receiving a user input via an electronic user interface and/or an automatic system input, wherein the input includes a required value for covering scenarios stored in a storage unit and/or a required number of scenarios to be tested, such that a selection and an order of execution of scenarios is determined such that the graph has maximum coverage; and providing the selection and the order of execution and/or a coverage value of an overall coverage of the selection of scenarios.

13. A non-transitory computer-readable medium having processor-executable instructions stored thereon for providing a scenario test process in relation to scenarios to be tested, in particular traffic scenarios, for tests of a device for driving a vehicle at least partially autonomously, wherein the processor-executable instructions, when executed, facilitate:

training and using a similarity classification module to classify similarity between two scenarios based on respective subsets of respective parameter sets of the two scenarios, wherein the two scenarios are virtual representations of actual traffic situations;

generating a graph representation including a multiplicity of scenarios, including the two scenarios, wherein respective nodes represent respective subsets of respective parameter sets of respective scenarios, and edges between respective nodes are weighted by a similarity classification value which indicates the similarity between respective scenarios corresponding to the respective nodes;

receiving a user input via an electronic user interface and/or an automatic system input, wherein the input includes a required value for covering scenarios stored in a storage unit and/or a required number of scenarios to be tested, such that a selection and an order of execution of scenarios is determined such that the graph has maximum coverage; and providing the selection and the order of execution and/or a coverage value of an overall coverage of the selection of scenarios.

* * * * *